United States Patent [19]

Akamatsu

[11] Patent Number: 4,488,059
[45] Date of Patent: Dec. 11, 1984

[54] SEMICONDUCTOR SWITCH DEVICE

[75] Inventor: Masahiko Akamatsu, Amagasaki, Japan

[73] Assignee: Mitsubishi Denki Kabushiki Kaisha, Tokyo, Japan

[21] Appl. No.: 417,632

[22] Filed: Sep. 13, 1982

Related U.S. Application Data

[63] Continuation of Ser. No. 201,562, Oct. 28, 1980, abandoned, which is a continuation of Ser. No. 001,167, Jan. 5, 1979, abandoned, which is a continuation of Ser. No. 798,675, May 19, 1977, abandoned, which is a continuation-in-part of Ser. No. 704,533, Jul. 12, 1976, Pat. No. 4,066,956.

[30] Foreign Application Priority Data

Sep. 12, 1975 [JP] Japan ................................ 50-111315

[51] Int. Cl.³ .................... H03K 17/60; H03K 17/94
[52] U.S. Cl. .................................. 307/253; 307/275; 307/314
[58] Field of Search .............. 307/253, 254, 314, 275; 331/112

[56] References Cited

U.S. PATENT DOCUMENTS 3,219,844  11/1965  Martin ................................ 307/254
3,657,569  4/1972  Froeschle ........................... 307/275

Primary Examiner—John Zazworsky
Attorney, Agent, or Firm—Oblon, Fisher, Spivak, McClelland & Maier

[57] ABSTRACT

A semiconductor switch device is disclosed with a main current passing through a main current path and a main semiconductor switch which has control electrode and a main electrode inserted into the path. A first winding is inserted into the electric path and a second winding is magnetically coupled to the first winding through a core and is connected between the control electrode and one main electrode of the main semiconductor switch. A third winding having a number of turns greater than the second winding is likewise magnetically coupled to said first winding. An auxiliary semiconductor switch is connected between both ends of the third winding and cooperates with a pulse signal input to provide a starting signal to the control electrode in the main semiconductor switch so that the auxiliary semiconductor switch is controlled in order to short-circuit both ends of the third winding and the control currents supplied by the first winding through the second winding is thereby cut off to turn off the main semiconductor switch.

3 Claims, 3 Drawing Figures

4,488,059

SEMICONDUCTOR SWITCH DEVICE

CROSS REFERENCE TO RELATED APPLICATIONS

This application is a continuation of application Ser. No. 201,562 filed on Oct. 28, 1980 and now abandoned, which application was a continuation of application Ser. No. 001,167 filed on Jan. 5, 1979 and now abandoned, which application was a continuation of Ser. No. 798,675 filed on May 19, 1977 and now abandoned, which application was a continuation in part of Ser. No. 704,533 filed on July 12, 1976, now U.S. Pat. No. 4,066,956.

BACKGROUND OF THE INVENTION

1. Field of the Invention

The present invention relates to improvements in semiconductor switch devices, and more particularly to improvements in semiconductor switch device using transistor wherein a secondary output of a current transformer which responds to a main current is supplied as a control electrode current.

2. Description of the Prior Art

In semiconductor switches, there has been a growing interest in the development of simplified means for supplying and controlling the control electrode current. In practice, such control current, if considerably large, can hardly be isolated and on-off controlled. To do this, prior art techniques have had to use a control electrode power source capable of isolated power supply for each switch unit, which has necessitated transformers and rectifiers of large capacity. When a large control electrode current is necessary to cope with a maximum main current, the power source must be large enough to deal with such current.

SUMMARY OF THE INVENTION

It is an object of the present invention to provide a semiconductor switch device wherein a third winding (short-circuit windings) is formed in a current transformer and the number of turns of the third winding is more than that of a second winding and an auxiliary semiconductor switch is connected between both terminals of the third winding to improve the characteristics of a main semiconductor switch for breaking the control electrode current.

The second object of the present invention is to provide the semiconductor switch device wherein the second winding and the third winding of the current transformer are separated to shift the control electrode potential of the auxiliary semiconductor switch connected to the third winding to suitable potential of a control circuit whereby the practical application is improved and the continuous control electrode signal is easily applied to the auxiliary semiconductor switch to prevent erroneous operation of the auxiliary semiconductor switch.

The third object of the present invention is to provide a semiconductor switch device wherein a pulse voltage applying means is connected to the third winding to provide magnetomotive force having polarity opposite to that of magnetomotive force of the third winding by the current passed through the first winding of the current transformer (primary) whereby the reset of the third winding of the current transformer and the reset of the core are attained.

Further objects, features and advantages of the invention will become more apparent from the following description taken in conjunction with the accompanying drawings.

DETAILED DESCRIPTION OF THE PREFERRED EMBODIMENTS

Figure 1:
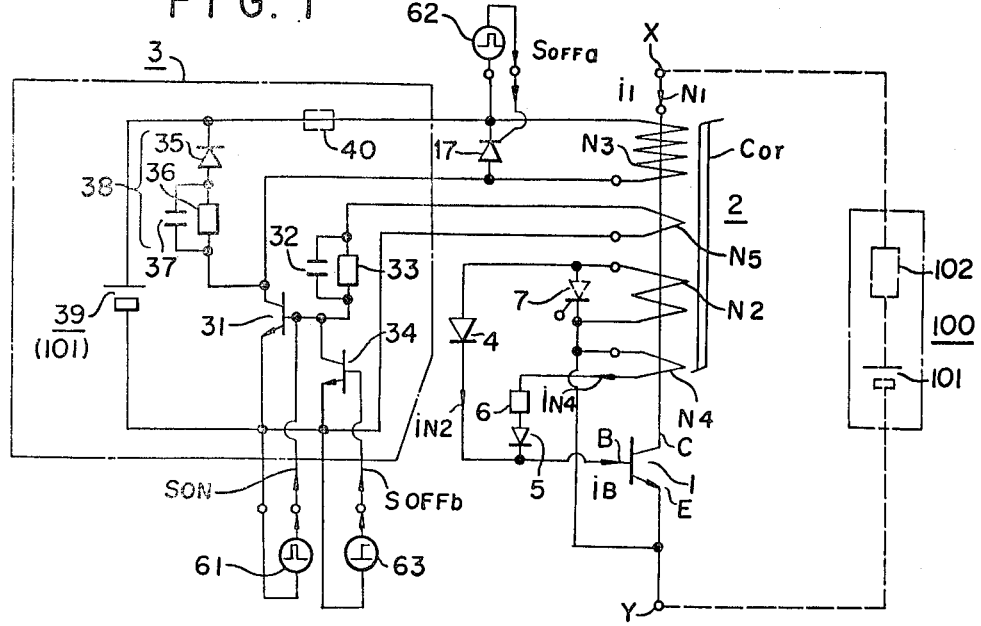
FIG. 1 is a circuit diagram showing one embodiment of the invention.

Referring to FIG. 1, there is schematically shown a switch circuit of one embodiment of the invention which comprises a semiconductor switch (1) and a voltage transformer (2).

The semiconductor switch (1) has a pair of main electrodes C and E inserted serially in a power path X-Y. The transformer (2) has a first winding (or first conductor) $N_1$ inserted in the main current path for the semiconductor switch (1), and a second winding $N_2$ connected to the control electrode B and one of the main electrodes E of the semiconductor switch (1). The second winding $N_2$ is connected forwardly to electrode through a rectifier element (4) and supplies electrodes with a current induced by the flow of current $i_1$ in the first winding. The transformer (2) further comprises a third winding $N_3$ having a number of the turns more than that of the second windings $N_2$ and a fourth winding $N_4$ for supplying the electrodes with a control current induced by the flow of current in the third winding $N_3$. The fourth winding $N_4$ is connected to electrodes B and E through a rectifier element (5) and a suitable current adjusting element (G) such as resistor.

An electrical pulse applying means (3) is provided for causing the third winding $N_3$ to generate a magnetomotive force having polarity opposite to that of the magnetomotive force caused by the current passing through the first winding $N_1$.

A short-circuit switch (7) such as a thyristor is provided to quickly break the second winding current $i_{N2}$ induced by the first winding current $i_1$.

In FIG. 1, the transformer (2) has a current transformer mode in which the first and second windings $N_1$ and $N_2$ operate as the primary and secondary windings respectively, and a voltage transformer mode in which the third and fourth windings $N_3$ and $N_4$ operate as the primary and secondary windings.

Figure 2:
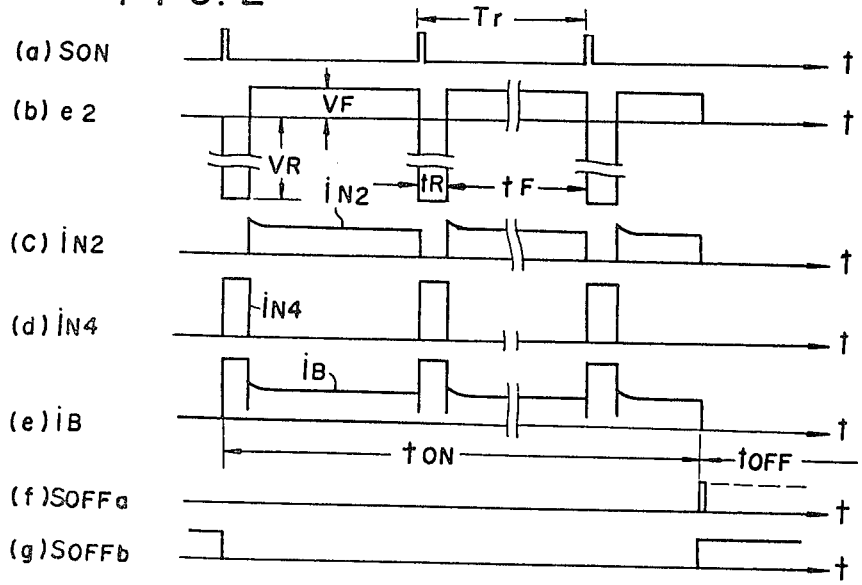
FIG. 2 is a waveform diagram for illustrating operations of the circuit shown in FIG. 1.

FIG. 2 shows waveforms; the period $t_F$ corresponds to the current transformer mode, and the period $t_R$ to the voltage transformer mode. The magnetic flux density of the core varies forwardly during the period $t_F$ or reversely during the period $t_R$ as shown by B-H loop in FIG. 3. The symbols used in FIG. 2 correspond to those indicating current or voltage in FIG. 1. In FIG. 2, the symbol $e_2$ designates the second winding electromotive force of the transformer (2).

At the beginning of turn-on operation, a negative voltage is applied to the third winding $N_3$ from the pulse applying means (3), to activate the transformer and thus resetting the core flux. The flux varies along $t_R$ in FIG. 3. Concurrently, a control electrode current $i_B$ is supplied by way of loop; fourth winding $N_4$-current adjusting element (6)-rectifier element (5)-control electrode B-main electrode E, in the waveform (d) in FIG. 2. For this period, the transformer negative voltage is $V_R$. (Instead of this operation, turn-on operation may be started in such manner that the short-circuit switch (7) is opened, a small amount of initial control electrode current is supplied from other means and thus turn-on operation is initiated from the current transformer mode).

Then, the application of the pulse voltage is stopped, causing the core flux to vary forward by the main current $i_1$ and thereby inducing a positive voltage. As a result, a secondary current $i_{N2}$ (i.e. the control electrode current) flows by way of the loop; second winding $N_2$-rectifier element (4)-control electrode B-main electrode E in the waveform (C) in FIG. 2.

For the necessary turn-on period $t_{ON}$, the two modes are repeated to enable a continuous control electrode current to be maintained in the waveform (e) in FIG. 2. In practice, a small dip of control electrode current $i_B$ will be present on a transition from one transformer mode to the other. This dip lasts but a very short period of time and is virtually negligible.

To break the control electrode current, the application of the pulse voltage is stopped to cause the transformer core to be saturated in a given length of time whereby the second winding current $i_{N2}$, e.g. the control electrodes current $i_B$ ceases.

To quickly break the control electrode current, the application of the pulse voltage is stopped whereby the control electrode current ceases immediately during the voltage transformer mode $t_R$. While, in the current transformer mode $t_F$, the short-circuit switch (7) is short-circuited whereby the second winding current $i_{N2}$ induced by the main current $i_1$ in the first winding $N_1$ goes to a short-circuit winding i.e. the third winding $N_3$ connected to the short-circuit switch, causing the control electrode current $i_B$ to cease.

In the present invention, the number of turns of the third winding $N_3$ is more than that of the second winding $N_2$ whereby the voltage of the third winding $N_3$ can be enough to maintain the ON state of the auxiliary semiconductor switch (31). The cut-off of the main semiconductor switch (1) caused by erroneous firing of the short circuit switch (7) can be prevented even when the voltage of the second winding $N_2$ is remarkably low during $t_F$.

Even though the change in the voltage is about several volts (about 1.2 to 5 volts) when the auxiliary semiconductor switch (31) is conductive, the second winding voltage can be lower than the control electrode threshold voltage of the main semiconductor switch (1).

That is, when a transistor is used as the auxiliary semiconductor switch (31), the allowable change in the voltage is large whereby the current application degree can be large and control electrode current can be small. When a thyristor is used as the auxiliary semiconductor switch (31), the forward to change in voltage $V_F$ is higher than 1.2 V. On the other hand, the threshold voltage $V_{th}$, of the main semiconductor switch (1) is in a range of 0.5 to 0.7 V.

The main semiconductor switch (1) can be cut-off without failure by providing the turn ratio of windings $N_3/N_2$ to higher than $F_F/V_{th}$, even though it is in the relation of $V_F > V_{th}$.

An improved pulse applying means (3) of the invention will be described below in reference to FIG. 1. The pulse applying means (3) has a power source (39) and a load (40), which may be part of the main power source (101) comprised in the main network (100) having a main power source (101) and a load (102). The circuit comprises an auxiliary switch (31) of a transistor for intermittently applying the power from the power source (39) to the third winding $N_3$.

The surge absorbing means (38) is provided comprising a rectifier element (35), a resistor (36) and a capacitor (37) to absorb a surge voltage present when the auxiliary switch (31) is turned off.

According to this embodiment, a detection means (fifth winding $N_5$) is provided for the transformer (2) in order to control the auxiliary switch (31), or the auxiliary switch (31) is controlled by way of a feedback coupling circuit (31, 32, 33 and $N_5$) in response to the output of the detection means $N_5$.

In this circuit construction, the auxiliary switch (31) becomes conductive by an on-trigger signal $S_{ON}$ supplied from a means (61), causing a voltage to be applied to the third winding $N_3$, a voltage to be induced across the fifth winding $N_5$, the auxiliary switch (31) to be kept conductive through the feedback coupling circuit, and the voltage transformer mode to be effected.

Figure 3:
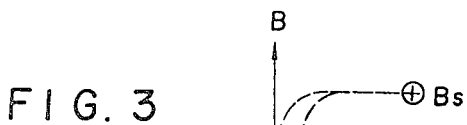
FIG. 3 is a graphic diagram showing B-H characteristics of the transformer core operated in the circuit of FIG. 1.

When the flux level of the transformer core $C_{or}$ goes to the negative saturation region $\ominus B_S$ on the B-H loop in FIG. 3, the electromotive force across the fifth winding $N_5$ decreases and the effect of maintaining the auxiliary switch conducting ceases, to make the auxiliary switch nonconducting. Accordingly, the voltage transformer mode is switched to the current transformer mode. Thus, when the core flux level reaches its negative saturation, it becomes possible to automatically stop the application of a pulse provided from the auxiliary switch. By applying an on-trigger signal $S_{ON}$ (a) in FIG. 2 having a period $T_r$, the foregoing repeating operation is performed.

A feedback releasing means (34) is provided for releasing the feedback maintaining the auxiliary switch (31) conducting and thus compulsorily turning off the auxiliary switch (31). The means (34) operates, for example, to close (or short) or open the control electrodes of the auxiliary switch (31). The switch means (34) is controlled by a means (63) which generates a signal $S_{OFFb}$ shown as (g) in FIG. 2 for turning off the main semiconductor switch for a period $t_{OFF}$. Another signal $S_{OFFa}$ (f) in FIG. 2 to be applied to the short-circuit switch (17) can be a pulse present in the beginning of period $t_{OFF}$ or a signal present over the period $t_{OFF}$ as indicated by the dotted line.

The short-circuit switch (7) can be a thyristor or a diode-transistor series. The auxiliary switch (31) and the feedback releasing switch (34) are preferably transistors, however, these switches can be thyristors or other semiconductor switches.

What is claimed is:
1. A semiconductor switch device, comprising:
   a main circuit carrying a main current, said main circuit including a first winding;
   a main semiconductor switch in said main circuit, having collector and emitter electrodes connected to said circuit and a base electrode;
   a second winding coupled to said first winding through a magnetic core, having a first end connected to the emitter electrode of said main semiconductor switch and a second end connected to said base electrode of said main semiconductor switch through a first diode;
   a third winding coupled to said first winding through said magnetic core, having a first end connected to a first terminal of an auxiliary power source, and a second end, said third winding having a number of turns, said number of turns being greater than the number turns of said second winding;

a fourth winding coupled to said first winding through said magnetic core, having a first end connected to said first end of said second winding and said emitter electrode of said main semiconductor switch and a second end connected through a second diode to the junction of said first diode and said base electrode of said main semiconductor switch;

an auxiliary semiconductor switch having a collector electrode connected to said second end of said third winding, an emitter electrode connected to a second terminal of said auxiliary power source and a base electrode;

means for supplying a first control signal having a first terminal connected to said base electrode of said auxiliary semiconductor switch and a second terminal connected to said emitter of said auxiliary semiconductor switch, said control signal having an on condition and an off condition, said on condition causing said auxiliary semiconductor switch to conduct, and allowing a first current to flow in a series circuit of said auxiliary power source, said third winding and said auxiliary semiconductor switch, said first current inducing a second current to turn on said main semiconductor switch, said second current flowing in a circuit including said fourth winding, said second diode, and said base and emitter electrodes of said main semiconductor switch, said off condition allowing said auxiliary semiconductor switch to turn off and stop said first current flow, the change in magnetic flux in said core varying thereby and inducing a third current to turn on said main semiconductor switch, said third current flowing in a circuit including said second winding, said first diode and said base and emitter electrodes of said main semiconductor switch, wherein said main semiconductor switch, is rendered conductive under either condition of said first control signal.

2. A semiconductor switch device according to claim 1 further comprising:

a turn off semiconductor switch having a collector electrode connected to the base electrode of said auxiliary semiconductor switch, an emitter electrode connected to the emitter electrode of said auxiliary semiconductor switch, and a base electrode;

a short circuit switch having first and second electrodes connected to said first and second ends of said third winding, and a third electrode;

means for supplying a turn off control signal connected to said base electrode of said turn off semiconductor switch for supplying a first turn off signal to make said turn off semiconductor switch conductive and said auxiliary semiconductor switch non-conductive; and to said third electrode of said short circuit switch for supplying a second turn off signal to make said short circuit switch conductive and short circuit said third winding;

wherein said second and third currents are no longer induced and said main semiconductor switch is rendered non-conductive.

3. A semiconductor switch device according to claim 1 further comprising:

a fifth winding coupled to said first winding through said magnetic core having a first end connected to the emitter electrode of said auxiliary semiconductor switch and second end connected to the base electrode of said auxiliary semiconductor switch;

wherein a fourth current is induced in said fifth winding by said first current flowing in said third winding, said fourth current flowing through said fifth winding and said base and emitter electrodes of said auxiliary semiconductor switch; and wherein said auxiliary semiconductor switch is maintained in a conductive state.

* * * * *